(12) United States Patent
Stone (10) Patent No.: US 7,501,894 B2
(45) Date of Patent: Mar. 10, 2009

(54) METHOD OF FORMING AN OPERATIONAL AMPLIFIER AND STRUCTURE THEREFOR

(75) Inventor: John D. Stone, Mesa, AZ (US)

(73) Assignee: Semiconductor Components Industries, L.L.C., Phoenix, AZ (US)

( * ) Notice: Subject to any disclaimer, the term of this patent is extended or adjusted under 35 U.S.C. 154(b) by 71 days.

(21) Appl. No.: 11/623,134

(22) Filed: Jan. 15, 2007

(65) Prior Publication Data

US 2008/0169876 A1 Jul. 17, 2008

(51) Int. Cl.
*H03F 3/45* (2006.01)
(52) U.S. Cl. .................................. 330/255
(58) Field of Classification Search .......... 330/252–261
See application file for complete search history.

(56) References Cited

U.S. PATENT DOCUMENTS

| 4,048,575 | A | | 9/1977 | Musa |
|---|---|---|---|---|
| 4,333,058 | A | | 6/1982 | Hoover |
| 4,737,732 | A | | 4/1988 | Westwick |
| 4,897,612 | A | * | 1/1990 | Carroll .......................... 330/253 |
| 6,163,217 | A | * | 12/2000 | Matsubara et al. .......... 330/255 |
| 7,019,588 | B2 | | 3/2006 | Wouters |
| 2006/0091953 | A1 | * | 5/2006 | Kronmueller ................ 330/255 |

OTHER PUBLICATIONS

"Analog MOS Integrated Circuits for Signal Processing" by Roubik Gregorian and Gabor C. Temes, ISBN 0-471-09797-7, MOS Operational Amplifiers, p. 214.

* cited by examiner

*Primary Examiner*—Robert Pascal
*Assistant Examiner*—Khiem D Nguyen
(74) *Attorney, Agent, or Firm*—Robert F. Hightower (57) ABSTRACT

In one aspect, an operational amplifier is configured to form a quiescent current that is a ratio of a current of a current source of the operational amplifier and to provide a load current to a load that is not ratioed to the current of the current source.

20 Claims, 4 Drawing Sheets

METHOD OF FORMING AN OPERATIONAL AMPLIFIER AND STRUCTURE THEREFOR

BACKGROUND OF THE INVENTION

The present invention relates, in general, to electronics, and more particularly, to methods of forming semiconductor devices and structure.

In the past, the semiconductor industry utilized various methods and structures to form operational amplifiers. One design of previous operational amplifiers generally provided an operational amplifier with a voltage swing on the output that went substantially from one power supply rail to the other. Additionally, the output desirably supplied a relatively large current to load the connected to the output of the operational amplifier. However, under no load conditions such operational amplifiers generally had a large quiescent current. Some of these previous operational amplifiers also required complex circuitry and often included several sets of differential pair connected transistors in order to implement the operational amplifier.

Accordingly, it is desirable to have an operational amplifier that has a large output voltage swing, that can supply large currents to a load, and that has a small quiescent current under no load conditions.

For simplicity and clarity of the illustration, elements in the figures are not necessarily to scale, and the same reference numbers in different figures denote the same elements. Additionally, descriptions and details of well-known steps and elements are omitted for simplicity of the description. As used herein current carrying electrode means an element of a device that carries current through the device such as a source or a drain of an MOS transistor or an emitter or a collector of a bipolar transistor or a cathode or anode of a diode, and a control electrode means an element of the device that controls current through the device such as a gate of an MOS transistor or a base of a bipolar transistor. Although the devices are explained herein as certain N-channel or P-Channel devices, a person of ordinary skill in the art will appreciate that complementary devices are also possible in accordance with the present invention. It will be appreciated by those skilled in the art that the words during, while, and when as used herein are not exact terms that mean an action takes place instantly upon an initiating action but that there may be some small but reasonable delay, such as a propagation delay, between the reaction that is initiated by the initial action.

DETAILED DESCRIPTION OF THE DRAWINGS

Figure 1:
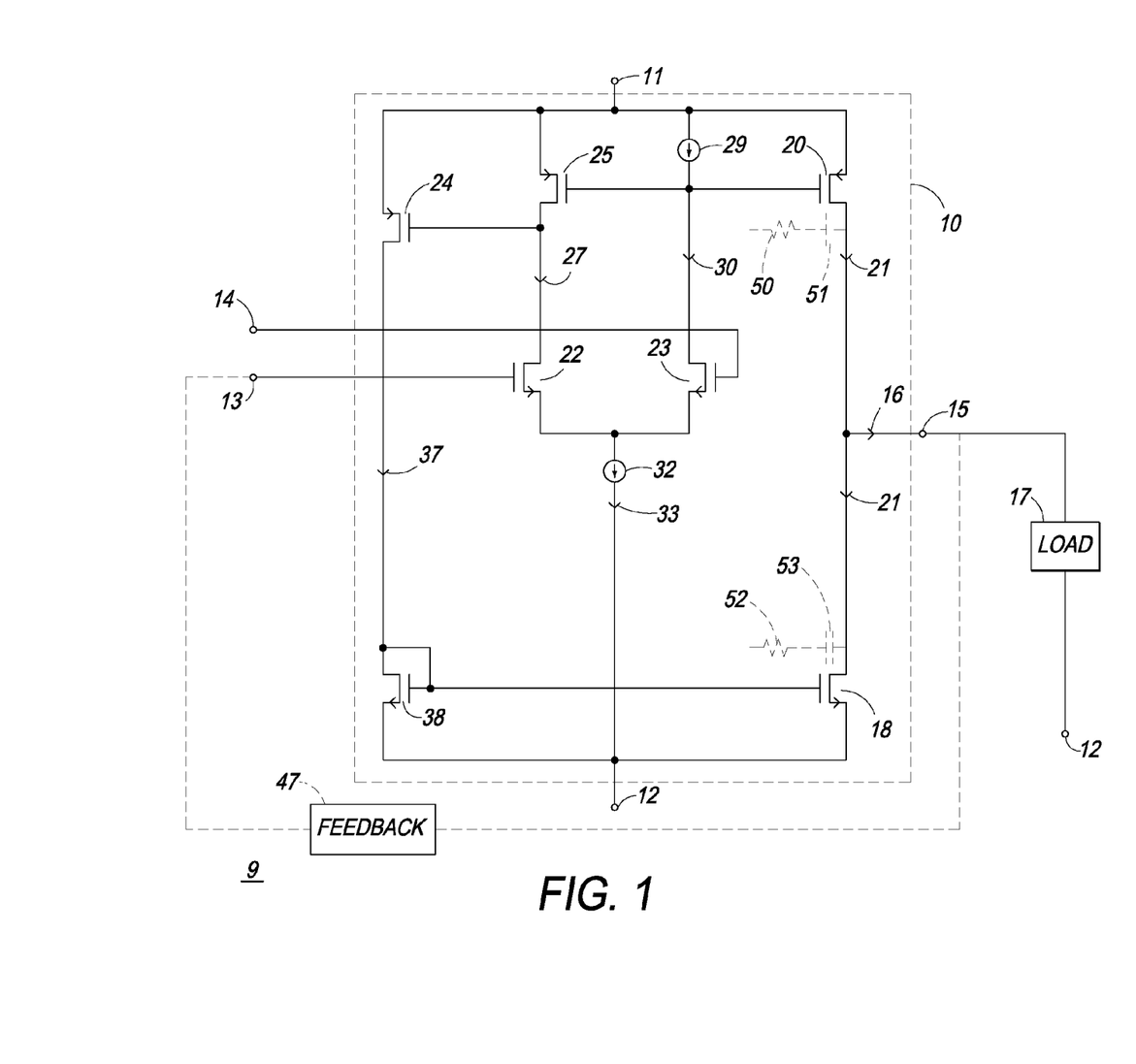
FIG. 1 schematically illustrates an embodiment of a portion of an operational amplifier in accordance with the present invention.

FIG. 1 schematically illustrates an embodiment of a portion of an amplifier circuit 9 that includes an operational amplifier 10. Operational amplifier 10 is configured to form a quiescent current this is controlled to be a ratio of a current from a current source of amplifier 10 and configured to form a maximum load current that is not a ratio of the current from the current source. A load 17 generally is connected to an output 15 of amplifier 10 to receive a load current 16 from amplifier 10. In some cases, load 17 may require load current 16 from amplifier 10 and in other cases, load 17 may not require load current 16. For example, if load 17 is a capacitive load, load current 16 may only be required to charge the capacitor to a voltage, and after the charging is complete load current 16 may become substantially zero.

Operational amplifier 10 includes a pair of output transistors 18 and 20 that are configured in a half-bridge or stacked configuration between a supply voltage input 11 and a common voltage terminal or supply voltage return 12 of amplifier 10. Output transistor 20 is configured to receive the supply voltage from input 11 and source current to form output current 16. Transistor 18 is configured to sink current 16 through transistor 18 to return 12. Amplifier 10 also includes a single set or pair of differential coupled transistors illustrated as differential pair transistors 22 and 23. Differential pair transistors 22 and 23 receive input signals between respective inputs 13 and 14 and control the value of current 16 responsively to the input signals. A current source 32 of amplifier 10 provides a substantially constant bias current or dc common mode current 33 that flows through differential pair transistors 22 and 23. A control circuit of amplifier 10 includes a current source 29 in addition to transistors 24, 25, and 38.

In most applications, amplifier 10 will be connected in a feedback configuration such as with a feedback network 47 connected between output 15 and one of inputs 13 and 14. One example of a feedback network connection is illustrated in dashed lines as a feedback network or feedback 47. Such feedback networks are well known to those skilled in the art. In other embodiments, other elements may be connected to input 13 or input 14 to provide other feedback or signal input configurations. In operation of such a configuration when load 17 does not require a load current, the value of current 16 is substantially zero. However, because current 33 biases transistors 22 and 23, a quiescent current 21 flows through transistors 18 and 20. Quiescent current 21 is a substantially dc current. For clarity of the explanation under the condition of load current 16 being substantially zero, the operation of the preferred embodiment of amplifier 10 is explained; however, other embodiments should provide similar operation with ratios between the current sources and the transistors than the ratios that are used for the explanation of the preferred embodiment. The control circuit of amplifier 10 is configured to control quiescent current 21 to be a ratio of the value of current 33. Thus, the value of quiescent current 21 can be set to a particular value while, contrastingly, the maximum value of load current 16 is controlled by the gain provided by transistors 22 and 23 and is not limited to a particular value that is set by current source 32 or current source 29. In operation when the value of load current 16 is substantially zero, the current through transistors 22 and 23 has to sum to the value of current 33. Current source 29 is configured to provide a current 30 that preferably is substantially one-half the value of current 33. Thus, the value of current 30 through transistor 23 preferably is approximately one-half of current 33 which forces the value of current 27 through transistors 22 and 25 to also be approximately one-half of the value of current 33. Because transistors 25 and 20 have the same gate-to-source (Vgs) voltage, the value of current 21 through transistor 20 is forced to be ratioed to the value of current 27 by the size ratio between transistors 20 and 25. Thus, current 21 is ratioed to the value of current 33 by the size ratio between transistors 20 and 25 and the ratio of current 30 to current 33. In the preferred embodiment, transistors 20 and 25 are the same size so that current 21 is substantially equal to current 30 and approximately one-half of current 33. The current mirror configuration between transistors 18 and 38 forces current 21 through transistor 18 to be ratioed to the value of current 37 by the size ratio between transistors 18 and 38. Since the current through transistor 18 is current 21, current 37 is ratioed to current 21 by the size ratio between transistors 18 and 38. In the preferred embodiment, the ratio is 1:1 so current 37 is substantially equal to current 21. The value of current 27 is ratioed to current 30 by the size ratio of transistors 25 and 20. In the preferred embodiment, this size ratio is 1:1 so the value of current 27 is equal to current 21. Thus, current 21 through transistor 18 is ratioed to current 33 through the size ratio between transistors 18 and 38, the size ratio between transistors 24 and 25, and the ratio between current 30 and current 33. Consequently, the value of quiescent current 21 can be controlled to be as small as desired by choosing the value of current 33 and the ratio of transistors as described hereinbefore.

As indicated hereinbefore, the maximum value of current 16 is not controlled by the value of current 33. To determine the maximum value of current 16, assume for example that amplifier 10 is connected for open loop operation with load 17 configured to maintain transistors 18 and 29 in the saturation region. A voltage source type of load is one example load that provides such operation. Those skilled in the art will appreciate that operating transistors 18 and 29 in the saturation region generally means that the drain-source voltage is sufficient so that the MOS transistor amplifies signals according to the square law equation operational characteristics of the MOS transistor. Transistors 22 and 23 are formed to be substantially equal and have high gains so that a small change in the input signal applied to inputs 13 and 14 results in a large maximum value for current 16. For example, suppose that the signal on input 14 increases slightly. Because of the high gain of transistors 22 and 23, the Vgs increase causes transistor 23 to try and conduct more current than can be supplied by source 29. Since current source 29 can only supply a fixed value for current 30 and due to the voltage source load for load 17, the voltage on the drain of transistor 23 is forced to the saturation voltage of transistor 23 which also forces the Vgs of transistor 20 to the saturation voltage of transistor 23. Thus, the Vgs of transistor 20 causes transistor 20 to supply more current to output 15 as current 16. The maximum value of current 16 supplied by transistor 20 is shown in the following equation:

$$I20=(K(W20/2L20))*(V11-V14-Vgs23+Vst23-Vth20)^2$$

Where;
K-constant
I20-maximum current sourced by transistor 20 as current 16,
W20-width of transistor 20,
L20-length of transistor 20,
V11-voltage between input 11 and return 12,
V14-input signal applied to input 14 referenced to return 12,
Vgs23-gate-to-source voltage of transistor 23,
Vst23-drain-to-source saturation voltage of transistor 23, and
Vth20-threshold voltage of transistor 20.

Those skilled in the art will appreciate that with a different type of load 17 instead of a voltage source load, transistor 20 could pull output 15 to as close as possible to the supply voltage on input 11. Pulling down the gate of transistor 20 enables transistor 20 to conduct the maximum value for current 16. The voltage on the drain of transistor 23 also pulls the gate of transistor 25 low which more fully enhances transistor 25 thereby causing transistor 25 to pull the gate of transistor 24 substantially to the voltage of input 11. This decreases the Vgs of transistor 24 and inhibits transistor 24 from conducting any current. Consequently, no current flows through transistor 38. Due to the current mirror connection of transistors 38 and 18, no current flows through transistor 18 which substantially prevents transistor 18 from sinking any current 16.

If the input signal on input 13 increases, the gate voltage of transistor 22 causes transistor 22 to try to conduct more current and forces the voltage on the drain of transistor 22 to decrease. The increased current demand of transistor 22 causes transistor 23 to try and conduct less current and forces the voltage on the drain of transistor 23 to increase. Increasing the voltage on the drain of transistor 23 decreases the Vgs of transistor 20 thereby causing transistor 20 to conduct less. The reduced drain voltage of transistor 22 also forces transistor 25 to try and conduct more current to support the current demand of transistor 22 thereby increasing the Vgs of transistor 24 and increasing current 37. Because of the current mirror configuration of transistors 38 and 18, the increased value of current 37 increases the Vgs of transistor 38 and of transistor 18. Due to the large gain of transistor 18, the increased Vgs forces transistor 18 to conduct the maximum value of current 16.

The maximum value of current 16 supplied by transistor 18 is shown in the following equation:

$$I18=((L38*W18)/(L18*W38))*(K(W24/2L24))*(V11-V13-Vgs22+Vst22-Vth24)^2$$

Where;
I18-maximum value of current sunk by transistor 18 as current 16,
L38-length of transistor 38,
W18-width of transistor 18,
L18-length of transistor 18,
W38-width of transistor 38,
W24-width of transistor 24,
L24-length of transistor 24,
V13-input signal applied to input 13 referenced to return 12,
Vgs22-gate-to-source voltage of transistor 22,
Vst22-drain-to-source saturation voltage of transistor 22, and
Vth24-threshold voltage of transistor 24.

As shown by the above equations, the maximum value of current 16 supplied to load 17 is not a function of the value of current from current sources 32 and 29, but is function of the gain of transistors 18 and 20.

Amplifier 10 may also include frequency compensation elements to provide stability for the operation of amplifier 10. One example of frequency compensation elements is illustrated in FIG. 1 in dashed lines. A frequency compensation resistor 50 and capacitor 51 may be connected between the drain and gate of transistor 20 and another frequency compensation resistor 52 and capacitor 53 may be connected between the drain and gate of transistor 18. Alternately, frequency compensation frequency compensation resistor 52 and/or capacitor 53 may be connected between the gate and drain of transistor 25 without changing the connection of resistor 50 and capacitor 51.

The goal is to configure amplifier 10 so that the transistors 18 and 20 form only current 21 when the input signals to amplifier 10 are balanced. However, as is well known in the art there are always minor variances that prevent load current 16 from being identically equal. Additionally it is desired that the currents that are described are formed to be exactly zero or exactly equal but as is well known in the art there are always minor variances that prevent the currents from being identically exact but make them substantially equal or substantially zero. It is well established in the art that variances of up to about ten per cent (10%) are regarded as reasonable variances from the ideal goal of forming the ratios of the transistors and the current sources from keeping current 16 exactly zero or from making currents and transistors ratios exactly equal.

In order to implement this functionality for amplifier 10, a source of transistor 20 is connected to receive the input voltage from input 11. A drain of transistor 20 is commonly connected to output 15 and to a drain of transistor 18. A source of transistor 18 is connected to receive power through a connection to return 12. The gate of transistor 20 is connected to the drain of transistor 23. A gate of transistor 23 is connected to input 13 and a source is commonly connected to a first terminal of current source 32 and to the source of transistor 22. A gate of transistor 22 is connected to input 14 and a drain of transistor 22 is connected to a drain of transistor 25. A source of transistor 25 is connected to input 11. A first terminal of current source 29 is connected to input 11 and a second terminal is commonly connected to the gate of transistor 20, a gate of transistor 25, and the drain of transistor 23. A source of transistor 24 is connected input 11 and a gate of transistor 24 is connected to the drain of transistors 22 and 25. A drain of transistor 24 is commonly connected to a drain and the gate of transistor 38 and to the gate of transistor 18. A source of transistor 38 is connected to return 12. A second terminal of current source 32 is connected to return 12.

Figure 2:
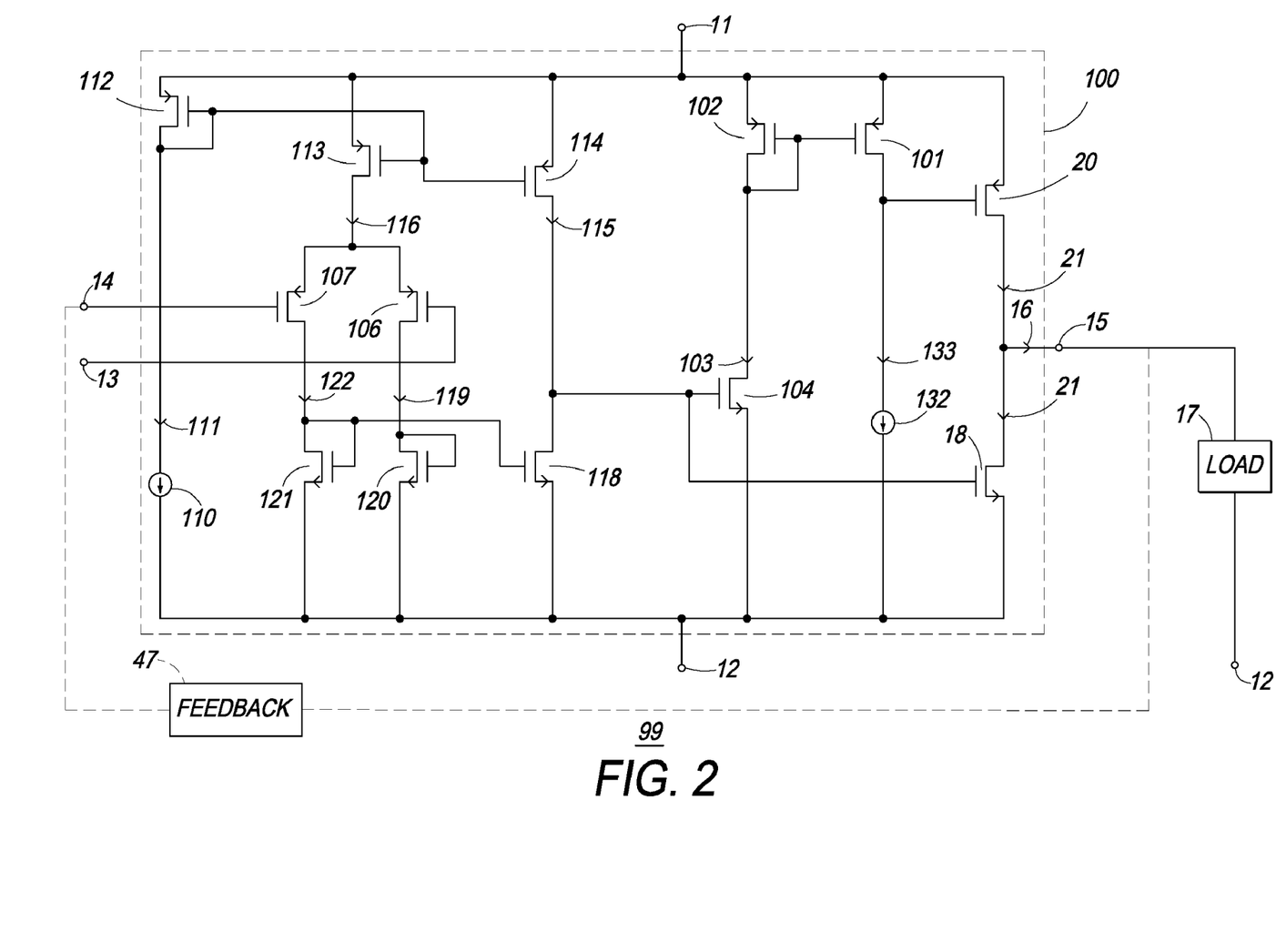
FIG. 2 schematically illustrates an embodiment of a portion of another operational amplifier that is an alternate embodiment of the operational amplifier of FIG. 1 in accordance with the present invention.

FIG. 2 schematically illustrates an embodiment of a portion of an amplifier circuit 99 that includes an operational amplifier 100. Amplifier 100 is an alternate embodiment of amplifier 10 that is explained in the description of FIG. 1. Amplifier 100 includes a single differential pair of transistors 106 and 107 in addition to transistors 120 and 121. Amplifier 100 also includes a transistor 104, a current source 110 that assists in forming the bias currents for transistors 106 and 107, a current source 132 that forms a current 133 to assist in forming quiescent current 21, current mirror coupled transistors 112, 113, and 114, current mirror coupled transistors 118 and 121, an optional transistor 120, and current mirror coupled transistors 101 and 102.

Bias currents 119 and 122 flow through respective transistors 106 and 107. Bias currents 119 and 122 are ratioed to a current 111 that is formed by current source 110. Current source 110 forces current 111 to flow through transistor 112. The current mirror configuration between transistors 112, 113, and 114 forces a current 116 to flow through transistor 113 and forces a current 115 to flow through transistor 114. With inputs 13 and 14 at substantially equal values Transistor 118 also conducts current 115. The current mirror configuration between transistors 118 and 121 forces currents 119 and 122 to flow through respective transistors 120 and 121. In the preferred embodiment, transistors 112, 113, and 114 are all the same size and transistors 120 and 121 are approximately one-half the size of transistor 118. Thus, current 116 is approximately equal to current 111 and currents 119 and 122 are each approximately one-half of current 111.

In most applications, amplifier 100 will be connected in the feedback configuration such as with feedback network 47 connected between output 15 and one of inputs 13 and 14. In operation of such a configuration when load 17 does not require a load current, the value of current 16 is substantially zero and the elements that control quiescent current 21 can be determined. For clarity of the explanation under the condition of load current 16 being substantially zero, the operation of the preferred embodiment of amplifier 100 is explained; however, other embodiments should provide similar operation with ratios between the current sources and the transistors than the ratios that are used for the explanation of the preferred embodiment. The control circuit of amplifier 100 is configured to control quiescent current 21 to be a ratio of the value of current 133. Thus, the value of quiescent current 21 can be set to a particular value while, contrastingly, the maximum value of load current 16 is controlled by the gain provided by transistors 106 and 107 and is not limited to a particular value that is set by current source 132. In operation when the value of load current 16 is substantially zero, transistor 101 controls transistor 20 so that current 21 through transistor 20 is ratioed to current 133 that flows through transistor 101. Because of the current mirror configuration between transistors 101 and 102, a current 103 flows through transistors 102 and 104. The value of current 103 is ratioed to current 133 by the size ratio between transistors 101 and 102. The gate voltages of transistors 104 and 18 are forced to be substantially equal, thus, current 21 through transistor 18 is ratioed to current 103 through transistor 104 by the size ratio between transistors 104 and 18. In the preferred embodiment, transistors 18 and 104 are approximately the same size and current 103 is approximately equal to current 21. Consequently, the value of current 21 through transistor 20 is ratioed to current 133 by the size ratio between transistors 20 and 101, and the value of current 21 through transistor 18 is ratioed to current 133 by the size ratio between transistors 101 and 102 and the size ratio between transistors 104 and 18.

As indicated hereinbefore, the maximum value of current 16 is not controlled by the value of current 133. To determine the maximum value of current 16, assume for example that amplifier 10 is connected for open loop operation with load 17 configured to maintain transistors 18 and 20 in the saturation region. Because of the high gain of transistors 106 and 107 and transistors 18 and 20, a small change in the input signals on inputs 13 and 14 results in a large change in the maximum value of load current 16. For example, if the signal on input 13 decreases a small amount, transistor 106 conducts more current which forces transistor 107 to conduct less current and decrease the value of current 122. Because of the current mirror configuration, decreasing current 122 decreases the Vgs of transistor 118 and forces transistor 118 to try and conduct less current. But the value of current 115 is substantially constant and is ratioed to the value of current 111, thus, the decreased Vgs of transistor 118 forces the drain voltage of transistor 118 to increase. Increasing the drain voltage of transistor 118 increases the Vgs of transistor 104 and causes transistor 104 to try and conduct more current which causes the drain voltage of transistor 104 to decrease. Decreasing the drain voltage of transistor 104 also increases the Vgs of transistors 102 and 101, and causes transistor 101 to try and conduct more current. Because the value of current 133 is substantially constant, the increased Vgs of transistor 101 forces the drain voltage of transistor 101 to increase thereby decreasing the Vgs of transistor 20. Due to the high gain of transistor 20, the decreased Vgs causes transistor 20 to substantially stop conducting and the value of current 16 from transistor 20 becomes substantially zero.

Additionally, increasing the drain voltage of transistor 118 increases the Vgs of transistor 18. Because of the high gain of transistor 18, a small increase in the Vgs causes transistor 18 to conduct the maximum value of current 16. The equation for the maximum value of current 16 through transistor 18 is shown below:

$$I18 = K(W18/(2*L18))*(Vgs18 - Vth18)^2$$
$$= K(W18/(2*L18))*(V11 - V12 - Vth18)^2$$

Where;
K-constant
I18-maximum current conducted by transistor 18 as current 16,
W18-width of transistor 18,
L18-length of transistor 20,
Vgs18-Vgs of transistor 18,
Vth18-threshold voltage of transistor 18
V11-the voltage on input 11, and
V12-the voltage on return 12.

If the signal on input 13 increases a small amount, transistor 106 conducts less current which forces transistor 107 to conduct more current thereby decreasing the value of current 119 and increasing the value of current 122. Increasing current 122 increases the Vgs of transistor 121 and because of the current mirror configuration also increases the Vgs of transistor 118. Since the value of current 115 is constant, the increased Vgs of transistor 118 forces the drain voltage of transistor 118 to decrease. Decreasing the drain voltage of transistor 118 decreases the Vgs of transistor 18. Because of the high gain of transistor 18, a small decrease in the Vgs causes transistor 18 to stop conducting thereby causing current 16 through transistor 18 to become substantially zero. Decreasing the drain voltage of transistor 118 also decreases the Vgs of transistor 104 causing transistor 104 to try and conduct less current. This causes the value of the drain voltage of transistor 104 to increase. The increased drain voltage of transistor 104 decreases the Vgs of transistors 102 and 101, and causes transistor 101 to try and conduct less current. Because the value of current 133 is substantially constant, the decreased Vgs of transistor 101 forces the drain voltage of transistor 101 to decrease thereby increasing the Vgs of transistor 20. Due to the high gain of transistor 20, the increased Vgs causes transistor 20 to conduct the maximum value of current 16. The equation for the maximum value of current 16 through transistor 20 is shown below:

$$I20 = K(W20/(2*L20))*(Vgs20 - Vth20)^2$$

Where;
K-constant
I20-maximum current conducted by transistor 20 as current 16,
W20-width of transistor 20,
L20-length of transistor 20,
Vgs20-Vgs of transistor 20, and
Vth20-threshold voltage of transistor 20.

A decrease in the value of the input signal on input 14 causes transistor 107 to conduct more current which forces transistor 106 to conduct less current and decrease the value of current 119 thereby increasing the Vgs of transistor 118. However, the value of current 115 is constant, thus, the increased gate voltage of transistor 118 forces the drain voltage of transistor 118 to decrease. The remainder of the effect on amplifier 100 is the same as previously explained for the increase in the value of the signal on input 13. An increase in the value of the signal on input 14 causes transistor 107 to conduct less and decrease the value of current 122. The remainder of the effect on amplifier 100 is the same as previously explained for the decrease in the value of the signal on input 13.

Figure 3:
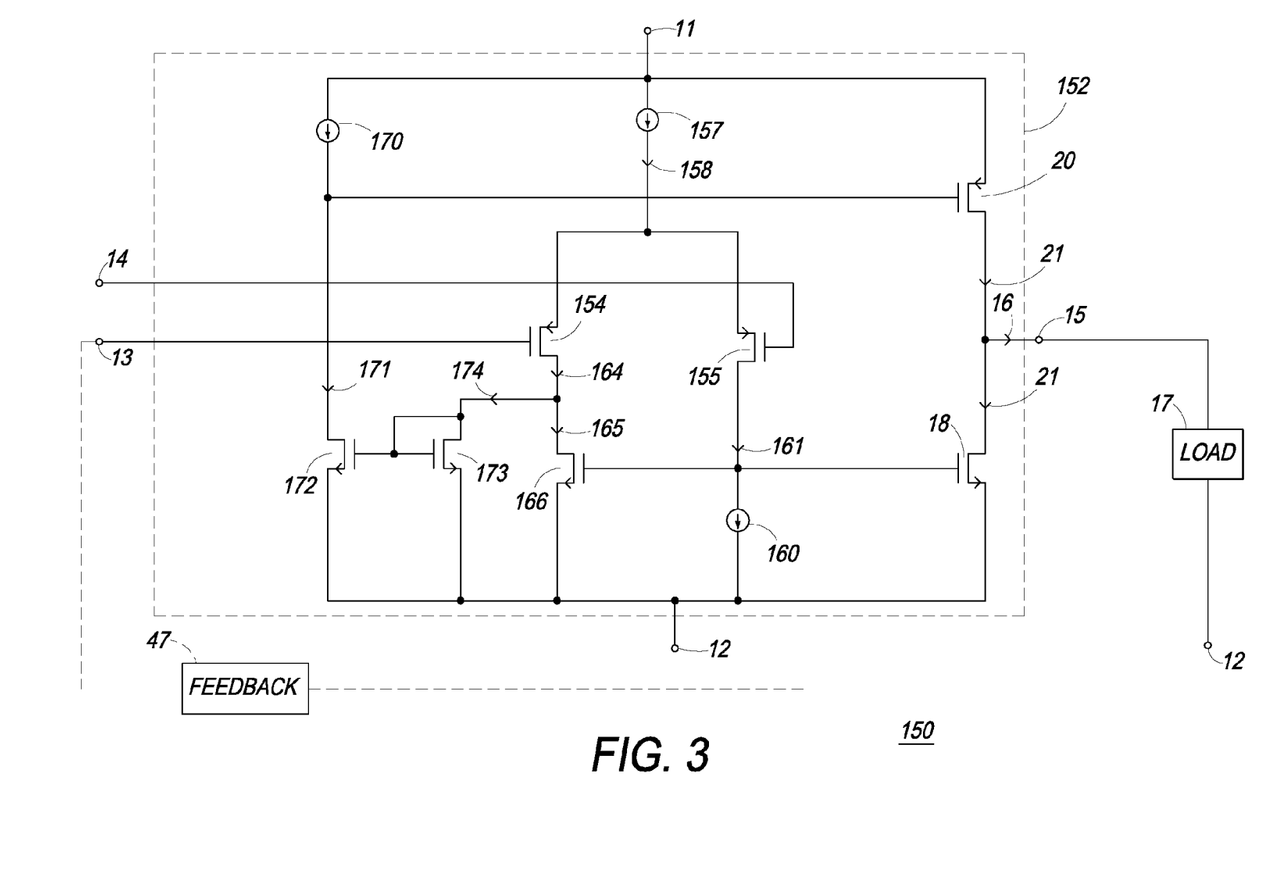
FIG. 3 schematically illustrates an embodiment of a portion of yet another operational amplifier that is an alternate embodiment of the operational amplifier of FIG. 1 in accordance with the present invention.

FIG. 3 schematically illustrates an embodiment of a portion of an amplifier circuit 150 that includes an operational amplifier 152. Amplifier 152 is an alternate embodiment of amplifier 10 that is explained in the description of FIG. 1. Amplifier 152 includes a single differential pair of transistors 154 and 155 in addition to a current source 160 and a transistor 166. Amplifier 150 also includes current mirror connected transistors 172 and 173, in addition to current sources 157 and 170.

In most applications, amplifier 152 will be connected in the feedback configuration such as with feedback network 47 connected between output 15 and one of inputs 13 and 14. In operation of such a configuration when load 17 does not require a load current, the value of current 16 is substantially zero and the elements that control quiescent current 21 can be determined. For clarity of the explanation under the condition of load current 16 being substantially zero, the operation of the preferred embodiment of amplifier 152 is explained; however, other embodiments should provide similar operation with ratios between the current sources and the transistors than the ratios that are used for the explanation of the preferred embodiment. The control circuit of amplifier 152 is configured to control quiescent current 21 to be a ratio of the value of a difference between a current 158 that is formed by current source 157 and a current 161 along with a current 171. Thus, the value of quiescent current 21 can be set to a particular value while, contrastingly, the maximum value of load current 16 is controlled by the gain provided by transistors 154 and 155 and is not limited to a particular value that is set by current sources 157 and 170. In operation when the value of load current 16 is substantially zero, current source 160 forms current 161 that flows through transistor 155. Current 161 preferably is about one-half of current 158, thus, a current 164 through transistor 154 is also about one-half of current 158. Current source 170 forms a current 171 that flows through transistor 172. The current mirror configuration of transistors 172 and 173 forces current 174 to be ratioed to current 171 by the size ratio of transistors 172 and 173. In the preferred embodiment, transistors 172 and 173 are approximately the same size and currents 171 and 174 are substantially equal. Current 165 through transistor 166 is current 164 minus current 174, thus, minus current 171. Consequently, current 165 is current 158 minus current 161 minus current 171. Because the Vgs of transistors 18 and 166 are substantially equal, current 21 through transistor 28 is ratioed to current 165 by the size ratio between transistors 18 and 166. In the preferred embodiment, the size of transistors 18 and 166 are approximately equal. If current 16 is zero, current 21 through transistor 20 has to be equal to current 21 through transistor 18. Thus, the value of current 21 is ratioed to the value of current 158 from source 157 by the value of currents 161 and 171, the size ratio between transistors 172 and 173, and the size ratio between transistors 18 and 166.

As indicated hereinbefore, the maximum value of current 16 is not ratioed to the value of current 158 or current 171 or current 161. To determine the maximum value of current 16, assume for example that amplifier 10 is connected for open loop operation with load 17 configured to maintain transistors 154 and 155 in the saturation region. Because of the high gain of transistors 154 and 155 and transistors 18 and 20, a small change in the input signals on inputs 13 and 14 results in a large change in the maximum value of load current 16. For example, if the signal on input 13 decreases a small amount, transistor 154 conducts more current which forces transistor 155 to conduct less current and increases the value of current 164. Decreasing current 161 decreases the Vgs of transistor 166, thus, the Vgs of transistor 18. Due to the high gain of transistors 18 and 166, the decreased Vgs causes transistors 18 and 166 to substantially stop conducting and the value of current 16 through transistor 18 becomes substantially zero. Increasing current 164 and decreasing current 165 causes an increase in current 174 through transistor 173. Transistors 172 and 173 are connected in a current mirror configuration with gates and sources tied together, so an increase in current 174 also increases current 171. Since current 170 is fixed, the voltage on the drain of transistor 172 is decreased. The decreasing drain voltage of 172 causes the Vgs of transistor 20 to decrease which causes transistor 20 to output the maximum value of current 16 through output 15. The equation for the maximum value of current 16 through transistor 20 is shown below:

$$I20=K(W20/(2*L20))*(V11-V12-Vth20)^2$$

Where;
K-constant
I20-maximum current conducted by transistor 20 as current 16,
W20-width of transistor 20,
L20-length of transistor 20,
V11-the voltage on input 11,
V12-the voltage on return 12, and
Vth20-threshold voltage of transistor 20.

If the signal on input 13 increases a small amount, transistor 154 conducts less current which forces transistor 155 to conduct more current and increases the value of current 161. Increasing current 165 and decreasing current 164 causes current 174 to decrease. As transistors 172 and 173 are in a mirror configuration with gates and sources tied, decreasing current 174 through transistor 173 also decreases current 171 through transistor 172. As current 171 is a fixed current, the drain voltage of transistor 172 increases as the current through transistor 172 decreases. This decreases the Vgs of transistor 20, thus making the value of current 21 through transistor 20 substantially zero. Increasing current 161 increases the Vgs of transistor 166, thus, the Vgs of transistor 18. Because of the high gain of transistor 18, the increased Vgs causes transistor 18 to conduct the maximum value of current 16. The equation for the maximum value of current 16 through transistor 18 is shown below:

$$I18=K(W18/(2*L18))*(Vin+Vgs155-Vsat155-Vth18)^2$$

Where;
K-constant
I18-maximum current conducted by transistor 18 as current 16,
W18-width of transistor 18,
L18-length of transistor 20,
Vin-the input voltage received on input 13 or input 14 relative to return 12,
Vgs155-Vgs of transistor 155,
Vsat155-the saturation voltage of transistor 155,
Vth18-threshold voltage of transistor 18.

As shown by the above equations, the maximum value of current 16 supplied to load 17 is not a function of the value of current from current sources 157 and 170, but is function of the gain of transistors 154 and 155 in addition to the gain of transistors 18 and 20. Also, the configuration of amplifier 152 provides a large value of current 16 through transistor 20 because transistor 20 receives a large Vgs from current source 170. Additionally the configuration of amplifier 152 keeps the sum of the quiescent currents through all transistors, except transistors 18 and 20, substantially constant for all conditions of current 16 including current 16 being substantially zero and the maximum value of current 16. This reduces the total power dissipation of amplifier 152.

Figure 4:
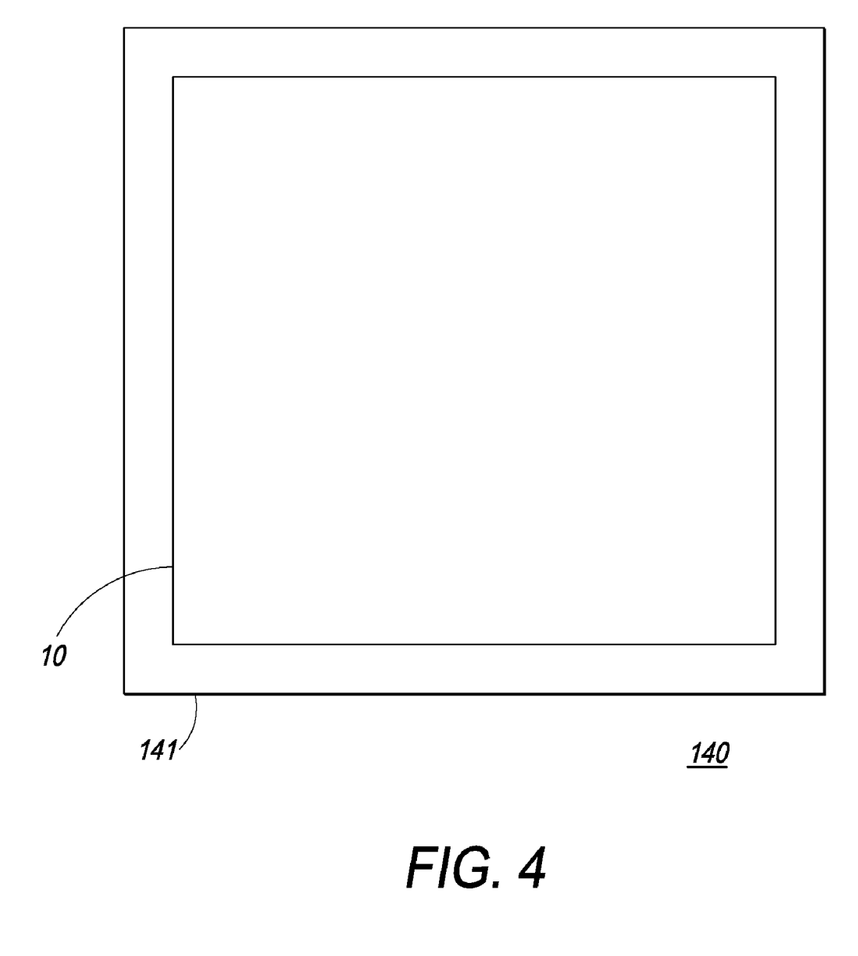
FIG. 4 schematically illustrates an enlarged plan view of a semiconductor device that includes the operational amplifier of FIG. 1 or FIG. 2 in accordance with the present invention.

FIG. 4 schematically illustrates an enlarged plan view of a portion of an embodiment of a semiconductor device or integrated circuit 140 that is formed on a semiconductor die 141. Amplifier 10 is formed on die 141. Die 141 may also include other circuits that are not shown in FIG. 4 for simplicity of the drawing. Amplifier 10 and device or integrated circuit 140 are formed on die 141 by semiconductor manufacturing techniques that are well known to those skilled in the art. Those skilled in the art will appreciate that amplifier 100 may also be formed on die 141 in addition to or instead of amplifier 10.

In view of all of the above, it is evident that a novel device and method is disclosed. Included, among other features, is forming an amplifier to have a single differential pair and to have a quiescent current that is ratioed to a current of a current source of the amplifier and to supply an ac current to a load wherein the ac current is not ratioed to the current from the current source. This configuration forms the amplifier to have fewer components of prior amplifiers thereby decreasing the amplifier's costs.

While the subject matter of the invention is described with specific preferred embodiments, it is evident that many alternatives and variations will be apparent to those skilled in the semiconductor arts. More specifically the subject matter of the invention has been described for a particular N-channel and P-channel transistors, although the method is directly applicable to other transistors, such as bipolar, BiCMOS, metal semiconductor FETs (MESFETs), HFETs, and other transistor structures. Additionally, the word "connected" is used throughout for clarity of the description, however, it is intended to have the same meaning as the word "coupled". Accordingly, "connected" should be interpreted as including either a direct connection or an indirect connection.

The invention claimed is:

1. An operational amplifier comprising:
a first transistor having a first current carrying electrode coupled to receive a first input voltage and source an output current to an output of the operational amplifier, the first transistor also having a second current carrying electrode and a control electrode;
a second transistor having a first current carrying electrode coupled to receive a common voltage and sink an output current from an output of the operational amplifier, the second transistor also having a second current carrying electrode and a control electrode;
a single differential pair having a third transistor coupled to receive a first input signal and a fourth transistor coupled to receive a second input signal, the third transistor having first and second current carrying electrodes and a control electrode, and the fourth transistor having first and second current carrying electrodes and a control electrode;
a first current source coupled to provide a constant current through at least one of the third or fourth transistors of the differential pair, the first current source having a first terminal and a second terminal; and
a control circuit coupled to the third transistor and the fourth transistor and configured to form a quiescent current through the first transistor and the second transistor that is ratioed to the constant current under the condition that substantially no load current flows through the first and second transistors and to form a maximum value of the output current that is not ratioed to the constant current.

2. The operational amplifier of claim 1 wherein the operational amplifier forms the output current responsively to a difference between the first input signal and the second input signal.

3. The operational amplifier of claim 1 wherein the control circuit includes a second current source having a first substantially constant current that is approximately one-half of the constant current, the second current source coupled to provide the first current to one of the third or the fourth transistors, the second current source having a first terminal and a second terminal.

4. The operational amplifier of claim 3 wherein the control circuit includes a fifth transistor coupled to the fourth transistor and coupled to receive the first substantially constant current, and wherein the first transistor is coupled to the fifth transistor to force a Vgs of the first transistor and the fifth transistor to be substantially equal, the fifth transistor having first and second current carrying electrodes and a control electrode.

5. The operational amplifier of claim 4 wherein the first current carrying electrode of the third transistor is commonly coupled to the control electrode of the first transistor, the control electrode of the fifth transistor, and the second terminal of the second current source and wherein the second current carrying electrode of the third transistor is commonly coupled to the second current carrying electrode of the fourth transistor and to the first terminal of the first current source.

6. The operational amplifier of claim 4 wherein the control circuit includes a sixth transistor coupled to the fifth transistor to form a second current that is ratioed to the first current, and further including a seventh transistor coupled in a current mirror configuration with the second transistor and configured to receive the second current from the sixth transistor, the sixth transistor having first and second current carrying electrodes and a control electrode, and the seventh transistor having first and second current carrying electrodes and a control electrode.

7. The operational amplifier of claim 6 wherein control electrode of the sixth transistor is commonly coupled to the first current carrying electrode of the fourth transistor, and to the second current carrying electrode of the fifth transistor, wherein the first current carrying electrode of the sixth transistor is coupled to the first current carrying electrode of the seventh transistor, and wherein the control electrode of the seventh transistor is coupled to the control electrode of the second transistor.

8. The operational amplifier of claim 1 wherein the second transistor is coupled in a current mirror configuration to receive a current that is ratioed to the constant current and responsively control the second transistor to conduct the quiescent current.

9. The operational amplifier of claim 1 further including a first compensation circuit coupled to the control electrode of the second transistor and a second compensation circuit coupled between the third and fourth transistors.

10. An operational amplifier comprising:
first and second transistors coupled in a stacked configuration to provide an output current to a load responsively to input signals to the operational amplifier and to form a quiescent current through both the first and second transistors;
a first current source coupled to provide a first current that is substantially constant to at least one of third and fourth transistors that are coupled as a sole differential pair of the operational amplifier; and
a control circuit configured to form a quiescent current through the first transistor and the second transistor that is a ratio of the first current and to form a maximum value of the output current that is not ratioed to the first current.

11. The operational amplifier of claim 10 wherein the control circuit is configured to form the quiescent current under a condition of substantially no load current flowing through the first and second transistors.

12. The operational amplifier of claim 10 further including a second current source coupled to provide a second current to one of the third or fourth transistors wherein the second current is a first ratio of the first current and forms a third current through the fourth transistor that is a second ratio of the first current.

13. The operational amplifier of claim 12 further including a fifth transistor coupled to receive the second current and coupled to control the quiescent current through the first transistor responsively to the value of the third current.

14. The operational amplifier of claim 13 further including a sixth transistor coupled to form a fourth current responsively to the third current wherein the fourth current is a third ratio of the first current.

15. The operational amplifier of claim 10 wherein the control circuit is configured to form a maximum value of both the load current through the first transistor and through the second transistor that is not ratioed to the first current.

16. A method of forming an operational amplifier comprising:
coupling a first transistor and a second transistor in a stacked configuration to form an output current responsively to input signals to the operational amplifier and to form a quiescent current through both the first and second transistors; and
configuring the operational amplifier to control the quiescent current through the first transistor and the second transistor to be a first ratio of a first current from a first current source of the operational amplifier and to form a maximum value of the output current that is not ratioed to the first current from the first current source.

17. The method of claim 16 wherein configuring the operational amplifier to control the quiescent current includes configuring the operational amplifier with a single differential transistor pair having a third transistor and a fourth transistor, and configuring a control circuit of the operational amplifier to control the first transistor to have the quiescent current that is a second ratio of a second current through one of the third or fourth transistors and configuring the control circuit to control the second transistor to have the quiescent current that is a third ratio of a third current through the other of the third or fourth transistors.

18. The method of claim 17 wherein configuring the control circuit of the operational amplifier to control the first transistor includes configuring the control circuit to form the second current and the third current to be substantially equal and to form the second ratio and the third ratio to be substantially equal.

19. The method of claim 17 wherein configuring the control circuit of the operational amplifier to control the first transistor includes coupling the first current source to form the first current through the third and fourth transistors, coupling a second current source to one of the third of fourth transistors to form the second current through the one of the third or fourth transistors, coupling a fifth transistor to the other of the third or fourth transistors and to the first transistor to control the quiescent current through the first transistor, coupling a sixth transistor to the fifth transistor to form a fourth current through the sixth transistor that is ratioed to the second current, and operably coupling the second transistor in a current mirror configuration to form the quiescent current through the second transistor as a the first ratio of the first current from the first current source.

20. The method of claim 16 wherein configuring the control circuit to control the quiescent current includes configuring the operation amplifier to maintain a sum of quiescent current through all transistors of the amplifier except the first transistor and the second transistor substantially constant for all values of current through the first transistor and the second transistor.

* * * * *